United States Patent [19]
Kromer et al.

[11] Patent Number: 5,745,844
[45] Date of Patent: Apr. 28, 1998

[54] RECEIVER CONTROL IN A COMMUNICATION DEVICE BY ANTENNA DE-TUNING IN STRONG SIGNAL CONDITIONS, AND METHOD THEREFOR

[75] Inventors: Jonathan William Joseph Kromer, Roanoke; Gregory Lewis Cannon, Keller, both of Tex.

[73] Assignee: Motorola, Inc., Schaumburg, Ill.

[21] Appl. No.: 720,887

[22] Filed: Oct. 4, 1996

[51] Int. Cl.⁶ ........................................ H04B 1/18
[52] U.S. Cl. .............. 455/193.1; 455/38.1; 455/226.2; 455/250.1; 455/195.1; 455/184.1; 455/186.1; 340/825.44; 330/298; 343/745; 333/17.1
[58] Field of Search ............... 455/232.1, 234.1, 455/239.1, 240.1, 241.1, 242.1, 242.2, 243.1, 245.2, 246.1, 249.1, 250.1, 251.1

[56] References Cited

U.S. PATENT DOCUMENTS

| | | |
|---|---|---|
| 3,571,719 | 3/1971 | Beary et al. ............ 455/193.3 |
| 4,053,838 | 10/1977 | Amaya . |
| 4,186,351 | 1/1980 | Brefini et al. ............ 455/226.2 |
| 4,450,588 | 5/1984 | Rohrich et al. . |
| 4,630,117 | 12/1986 | Parker ............ 343/678 |
| 4,862,516 | 8/1989 | Macnak et al. ............ 455/193.1 |
| 5,301,358 | 4/1994 | Gaslcill et al. ............ 455/193.2 |
| 5,359,607 | 10/1994 | Nguyen . |
| 5,369,792 | 11/1994 | Matsumoto et al. ............ 455/249.1 |

*Primary Examiner*—Reinhard J. Eisenzopf
*Assistant Examiner*—Doris To
*Attorney, Agent, or Firm*—Pablo Meles

[57] ABSTRACT

A communication device (100) including an antenna (110) for receiving a signal. A receiver circuit (12) is coupled to the antenna (110) and demodulates the signal which is received by the antenna (110). A signal strength measuring circuit (126) is coupled to the antenna (110) and generates a signal strength indicator signal representing a strength of the signal received by the antenna (110). A controller (130) is coupled to the receiver circuit (120) for receiving the signal strength indicator signal and generating a tuning signal in response thereto. An antenna tuning circuit (140) is coupled to the controller (130) and is responsive to the tuning signal for tuning the antenna (110) to a reduced gain level when the strength of the signal received by the antenna (110) is indicative of strong signal conditions.

9 Claims, 3 Drawing Sheets

RECEIVER CONTROL IN A COMMUNICATION DEVICE BY ANTENNA DE-TUNING IN STRONG SIGNAL CONDITIONS, AND METHOD THEREFOR

FIELD OF THE INVENTION

This invention relates in general to communication devices, such as selective call receivers, and more specifically to improving the sensitivity of a receiver circuit in a communication device.

BACKGROUND OF THE INVENTION

Conventionally, a radio frequency (RF) communication device, such as a selective call receiver (pager), is designed to have very high gain and low noise characteristics in order to maximize receiver circuit sensitivity in order to detect very weak signals. On the other hand, when the received signal becomes stronger, the receiver circuit can be overloaded or saturated, causing operation of its amplifiers in non-linear regions, ultimately degrading performance. Consequently, it is common practice to provide automatic gain control in the receiver circuit to cut back the gain of the amplifiers in the receiver circuit in strong signal conditions. The stronger the received signal, the more the gain of the amplifiers is cut back.

What is needed is a way to improve the performance of a communication device in strong signal conditions.

DETAILED DESCRIPTION OF THE DRAWINGS

Figure 1:
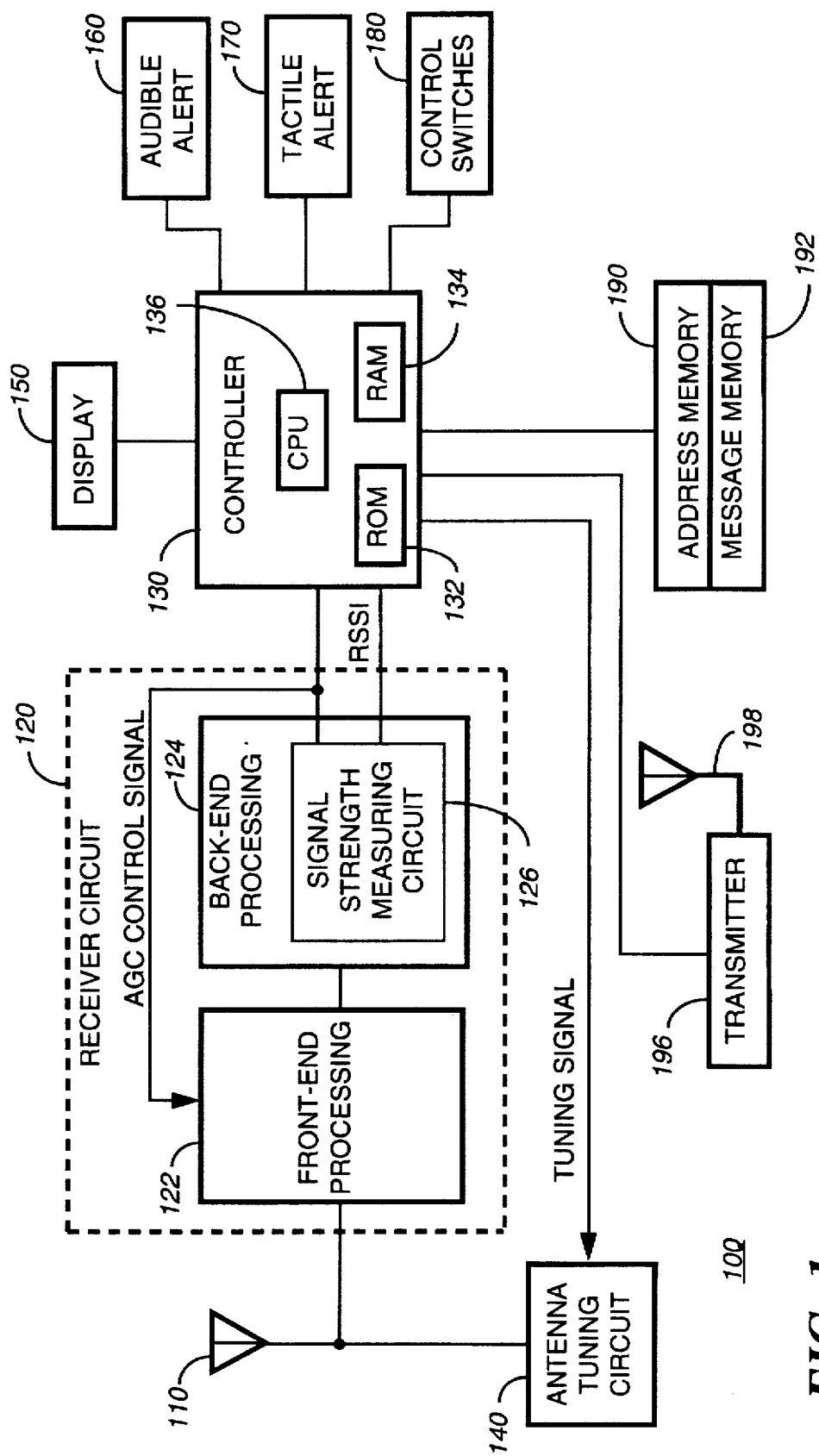
FIG. 1 is a block diagram of a communication device according to the present invention.

Referring first to FIG. 1, a communication device 100 is shown. The communication device 100 comprises an antenna 110 for receiving signals transmitted to the communication device 100. A receiver circuit 120 has an input which is coupled to the antenna for demodulating the received signal(s). The receiver circuit 120 includes a front-end processing circuit 122 and a back-end processing circuit 124. The front-end processing circuit 122 typically includes amplifiers and filters for amplifying the received signal. The back-end processing circuit 124 typically includes mixers and filters for demodulating the received signal. The receiver circuit has an output that is coupled to a controller 130. The controller is the overall control point for the communication device 100. The controller 130 is a microprocessor based device which includes at least a ROM 132, a RAM 134 and a central processing unit (CPU) 136. The antenna 110 is tuned to the receiver circuit 120 by an antenna tuning circuit 140. The antenna tuning circuit 140 is controlled by a tuning signal generated by the controller 130 in response to a signal strength indicator signal supplied as input thereto.

According to the present invention, it is desirable to adjust the gain of the antenna 110 (also referred to as "tuning" the antenna), particularly when the communication device is experiencing strong signal conditions. To this end, the receiver circuit 120 includes, typically within the back-end processing circuit 124 (though it could be located with the front-end processing circuit 122), a signal strength measuring circuit 126 for measuring the strength of the received signal. The signal strength measuring circuit 126 can take the form of an automatic gain control (AGC) circuit or a circuit capable of generating a received signal strength information (RSSI) signal. In the case of the AGC circuit, an AGC control signal is generated based on the signal strength of the received signal in order to adjust the gain of amplifiers in the front-end processing circuit 122. The controller 130 is coupled to receive the RSSI signal and/or the AGC control signal, depending on which signal strength measuring circuit is in the receiver circuit 120. Other circuits for measuring the signal strength of the received signal capable of supplying such information are also useful. For purposes of simplicity, the term "signal strength indicator signal" will be used to mean the AGC control signal, RSSI signal or other similar information that represents the strength of the received signal.

Figure 2:
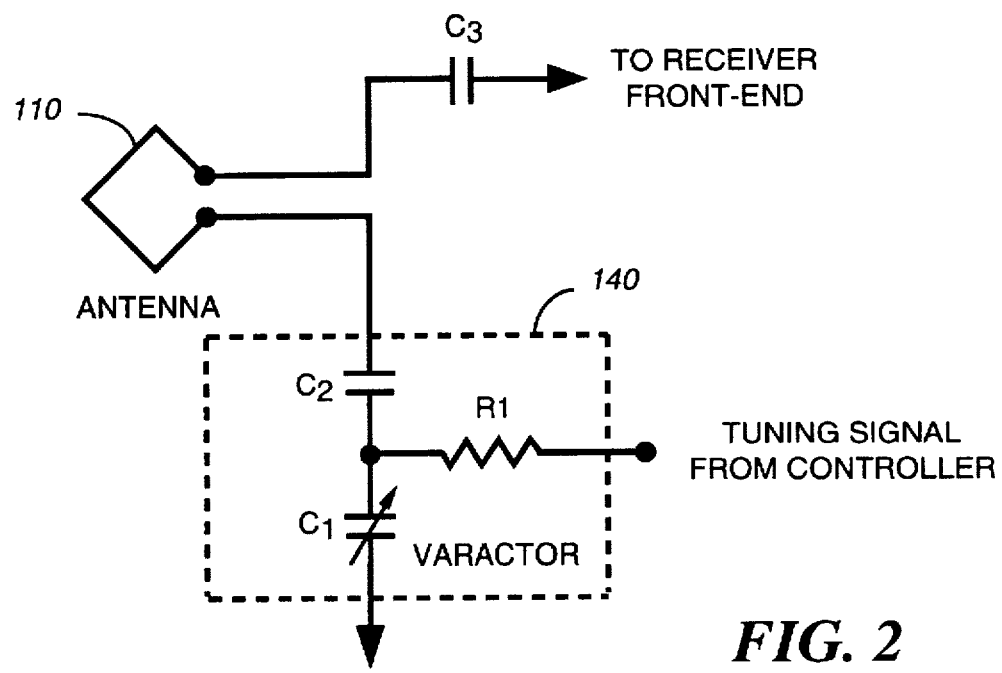
FIG. 2 is a electrical schematic diagram of an antenna tuning circuit in accordance with the present invention.

The controller 130 is responsive to the signal strength indicator signal to generate a tuning signal for controlling the gain of the antenna 110, by way of the antenna tuning circuit 140. The antenna tuning circuit 140 is shown in more detail in FIG. 2, and comprises a varactor C1, fixed capacitor C2 and a resistor R1 coupling the tuning signal from the controller 130. The antenna tuning circuit 140 is coupled between the antenna 110 and ground, as shown. The resonant frequency of the antenna is controlled by the loading capacitance, created by the combination of the capacitances of capacitor C1 and varactor C2, connected between it and ground. The tuning signal is a voltage DC voltage signal that is applied to the varactor C1 through the resistor R1 to adjust the capacitance of varactor C1 and thus in combination with capacitor C2, tune the resonant frequency of the antenna. In the conventional receiver, the antenna is tuned to have maximum gain at the desired receive frequency, whereas in the present invention, the antenna tuning circuit is responsive to the tuning signal for tuning the antenna to a reduced gain level when the strength of the signal received by the antenna is indicative of strong signal conditions.

The controller 130 generates the voltage for the tuning signal through the use of data stored in the ROM 132 or RAM 134. In particular, with reference to FIG. 3, a table is stored in the controller, that includes tuning signal control voltages for tuning the antenna to a range of gain values at a given operating frequency, depending on the signal strength of the received signal. Though actual values are not included in the table, it should be appreciated that as the values for the tuning signal voltages are such that they would cause a decrease in the gain of the antenna, with increasing signal strength. Thus, in the table, the voltage V8 at a high signal strength S8, would cause the antenna tuning circuit 140 to tune the antenna 110 to a minimum gain, decreasing the level of signal applied to the front-end processing circuit 122. The amplifiers in the front-end processing circuit 122 would be able to continue operation in their linear regions, maintaining the dynamic range of the receiver in strong signal conditions.

Figure 3:
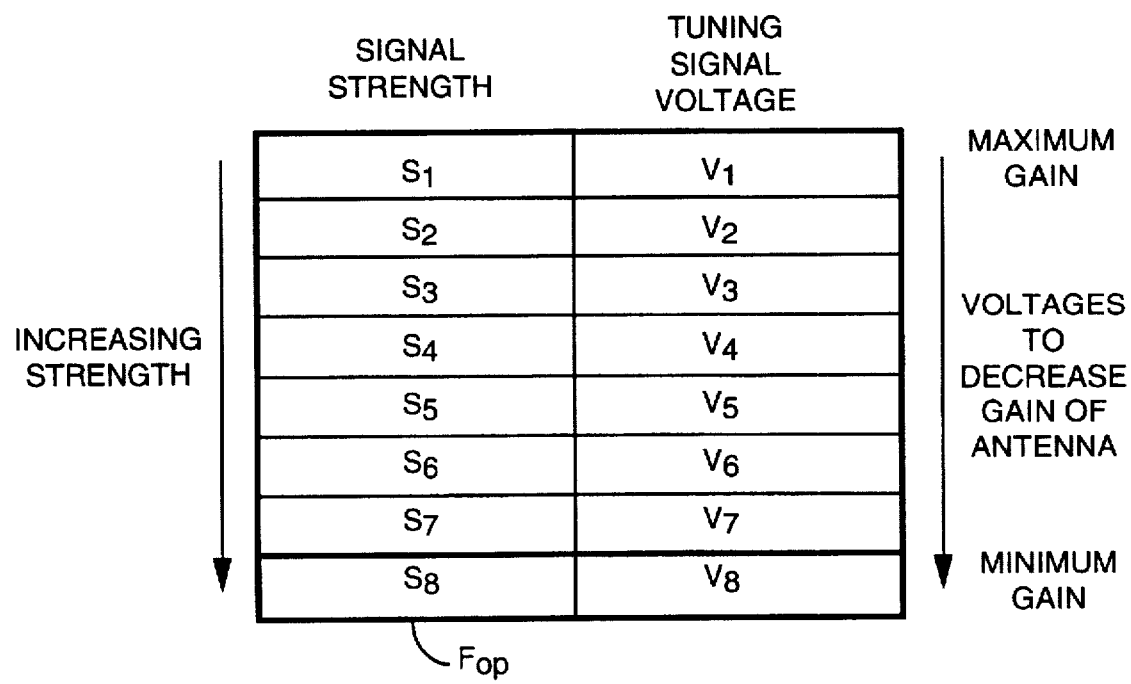
FIG. 3 is a table showing data used for tuning the antenna in a communication device according to the present invention.

The table shown in FIG. 3, which would be stored in the communication device, includes antenna tuning data for a particular operating frequency of the receiver circuit 120. Additional tables would be included for additional operating frequencies of the receiver circuit 120, or otherwise the data would be arranged in the ROM 132 or RAM 134 of the controller 130 to enable retrieval of the antenna tuning data.

dependent on the current operating frequency of the receiver circuit 120, assuming that the receiver circuit 120 has multiple operating frequencies. Furthermore, if an AGC control signal is used as the signal strength indicator signal, then AGC control signal values would be in the table, for the signal strength signals S1–Sn.

Figure 4:
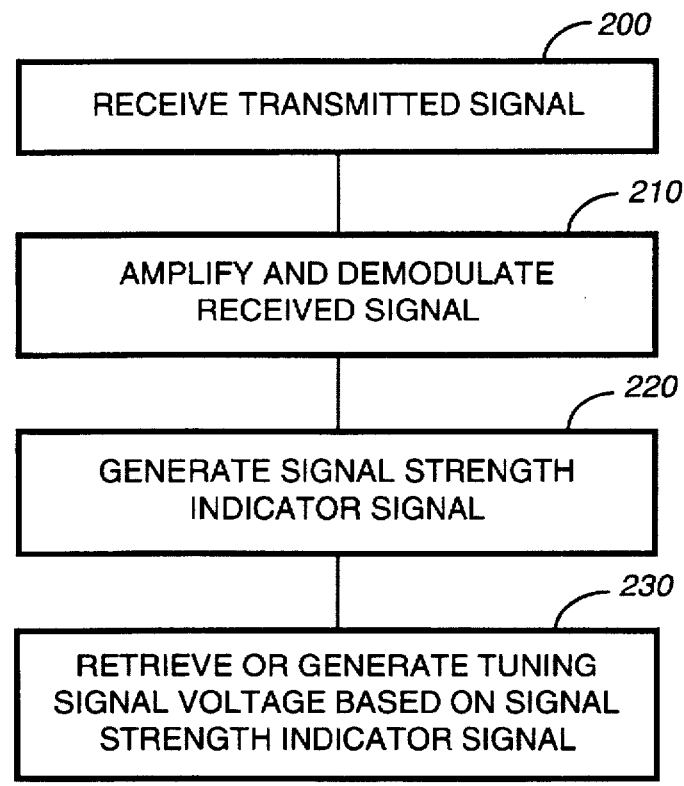
FIG. 4 is a flow chart depicting the operational steps of a communication device in accordance with the present invention.

FIG. 4 shows the method or process steps performed in the communication device 100 to tune the antenna in accordance with the present invention. Step 200 depicts the reception of a transmitted signal by the antenna 110 and step 210 depicts amplification and demodulation of the received signal. In step 220, a signal strength indicator signal is generated, either by an AGC circuit 126 or other RSSI generating circuit 128. Next, in step 230, the controller 130 generates a tuning signal voltage based on the signal strength indicator signal. More specifically, in step 230, the controller 130 accesses a table, similar to the one shown in FIG. 3, in order to retrieve a tuning signal voltage to adjust the gain of the antenna depending on the level of the signal strength indicator signal. In a strong signal condition, the antenna is tuned so as to reduce its gain. Alternatively, the controller may apply a mathematical algorithm to the signal strength indicator signal, in order to generate the appropriate tuning signal voltage.

The present invention has utility in a wide range of communication device applications. FIG. 1, as an example, shows that the communication device includes additional hardware to create a selective call receiver (paging/messaging) functionality. The communication device 100 comprises a display 150, an audible alert 160, a tactile alert 170, control switches 180 for user control of the device, address memory 190, and message memory 192 for storing messages. In addition, the communication device 100 may have transmitting functionality afforded by the transmitter 196 and antenna 198, as may be the case in a two-way paging device. However, it should be understood that FIG. 1 is only an example, and that the present invention has utility in any device that is required to receive a radio-frequency signal, where it is possible that the device will receive information in strong signal conditions, as well as other signal conditions.

The above description is intended by way of example only, and is not intended to limit the present invention in any way, except as set forth in the following claims.

What is claimed is:

1. A communication device comprising:

an antenna for receiving a signal;

a receiver circuit having an input coupled to the antenna and an output, the receiver circuit demodulating the signal which is received by the antenna and having a signal strength measuring circuit for generating a signal strength indicator signal representing a strength of the signal received by the antenna;

a controller coupled to the receiver circuit for receiving as input the signal strength indicator signal and generating a tuning signal in response thereto; and an antenna tuning circuit coupled to the controller and responsive to the tuning signal for tuning the antenna to a reduced gain level when the strength of the signal received by the antenna is indicative of strong signal conditions, wherein the controller comprises a microcontroller having a memory for storing a table of tuning signal voltages for tuning the antenna to a range of gain values at a given operating frequency dependent on the signal strength of the signal received by the antenna.

2. The communication device of claim 1, wherein the signal strength measuring circuit comprises an automatic gain control circuit, and wherein the signal strength indicator signal is an automatic gain control signal.

3. The communication device of claim 1, wherein the signal strength measuring circuit comprises a circuit which generates a received signal strength information signal.

4. The communication device of claim 1, wherein the antenna tuning circuit comprises a varactor coupled between the antenna and ground, the varactor being coupled to the tuning signal and responsive thereto to adjust a resonant frequency of the antenna.

5. The communication device of claim 1, wherein the communication device is a selective call receiver.

6. A method for tuning an antenna in a communication device comprising steps of:

receiving a signal;

measuring a strength of the signal that is received and generating a signal strength indicator signal representative thereof;

determining whether the strength of the signal is indicative of a strong signal condition; and tuning an antenna in the communication device so as to reduce a gain of the antenna when it is determined that the strength of the signal is indicative of a strong signal condition, wherein the step of tuning further comprises retrieving a voltage for a tuning signal from a stored table of tuning signal voltages which are designed to tune the antenna to a range of gain values at any given operating frequency dependent on the strength of the signal received by the antenna.

7. The method of claim 6, wherein the signal strength indicator signal is an automatic gain control signal, and wherein the step of measuring a strength of the signal comprises measuring a level of the automatic gain control signal.

8. The method of claim 6, wherein the signal strength indicator signal is a received signal strength information signal, and wherein the step of measuring a strength of the signal comprises measuring a level of the received signal strength information signal.

9. In combination, an antenna for receiving a signal; a receiver circuit coupled to the antenna for demodulating the signal which is received by the antenna and generating a signal strength indicator signal representing a strength of the signal received by the antenna; a controller coupled to the receiver circuit for receiving as input the signal strength indicator signal and generating a tuning signal in response thereto; and an antenna tuning circuit coupled to the controller and responsive to the tuning signal for tuning the antenna to a reduced gain level when the strength of the signal received by the antenna is indicative of strong signal conditions, wherein the controller uses a memory for storing a table of tuning signal voltages for tuning the antenna to a range of gain values at a given operating frequency dependent on the signal strength of the signal received by the antenna.

* * * * *